United States Patent [19]

Avery

[11] 3,857,105

[45] Dec. 24, 1974

[54] CASCADE AMPLIFIER USING COMPLEMENTARY CONDUCTIVITY TRANSISTORS

[75] Inventor: Leslie Ronald Avery, Byfleet, England

[73] Assignee: RCA Corporation, New York, N.Y.

[22] Filed: Dec. 3, 1973

[21] Appl. No.: 420,857

[30] Foreign Application Priority Data

Apr. 13, 1973 Great Britain .................... 18030/73

[52] U.S. Cl. ........................ 330/17, 330/19, 330/20, 330/22, 330/40, 330/117

[51] Int. Cl. ............................................. H03f 3/18

[58] Field of Search ............ 330/16, 17, 19, 20, 22, 330/40, 117; 307/313

[56] References Cited

UNITED STATES PATENTS

| | | | |
|---|---|---|---|
| 2,963,656 | 12/1960 | Parris | 330/17 |
| 3,411,019 | 11/1968 | Jorgensen | 307/313 |
| 3,470,497 | 9/1969 | Kotter | 307/313 |
| 3,473,134 | 10/1969 | Hughes | 330/17 |
| 3,474,345 | 10/1969 | Moses | 330/22 |
| 3,573,645 | 4/1971 | Wheatley, Jr. | 330/22 |

*Primary Examiner*—Stanley D. Miller, Jr.
*Attorney, Agent, or Firm*—H. Christoffersen; S. Cohen

[57] ABSTRACT

An amplifier comprising a cascade connection of common-emitter and common-base amplifier transistors of complementary conductivity types has a current source coupled to their interconnected collector and emitter electrodes, which constant current source is arranged to supply a current twice as large as the quiescent current in each of the transistors. Consequently, the amplifier displays symmetrical limiting of signals at the output circuit of the cascade connection. The emitter degeneration resistance of the common-emitter amplifier transistor may be equal to the collector load resistance of the common-base amplifier transistor, in which case equal amplitude signals having opposite senses of swing and having equal direct potential components are provided across the emitter degeneration resistance and the collector load resistance, respectively.

8 Claims, 3 Drawing Figures

CASCADE AMPLIFIER USING COMPLEMENTARY CONDUCTIVITY TRANSISTORS

Figure 1:
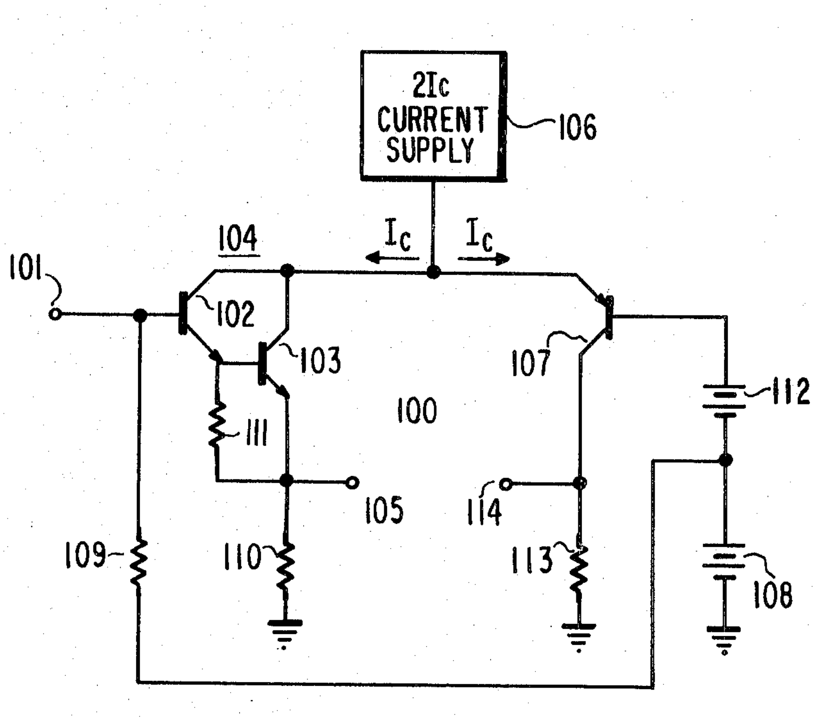

The present invention relates to a cascade amplifier using common-emitter amplifier and common-base amplifier transistors of complementary conductivity types and particularly to such configurations as are useful as phase-splitting amplifiers.

The so-called "concertina" phase-splitting amplifier uses a transistor having equal emitter degeneration resistance and collector load resistance, a first signal being provided at its emitter electrode by common-collector amplifier action and a second signal of like amplitude but opposite direction of swing at its collector electrode by common-emitter amplifier action. A principal problem with the concertina phase-splitter is that these output signals are not provided with similar direct potential components. This presents problems when one desires to direct couple the first and second signals to ensuing like circuits, for example, as is often desired in the design of monolithic integrated circuitry.

A differential amplifier with emitter-coupled transistors having equal collector load resistances provides a phase-splitting amplifier which overcomes this problem. However, it displays poor linearity unless the coupling between the transistor emitter electrodes includes substantial degeneration resistance. Such linearization techniques interfere with the ability of the amplifier to provide first and second signals which may swing over the full range of applied operating potential. The concertina phase-splitting amplifier cannot provide first and second signals ranging over more than half the applied operating potential.

One aspect of the present invention comprises a cascade combination of an input and an output amplifier transistors of different conductivity types connected emitter-to-collector through which equal, quiescent emitter-to-collector currents are caused to flow. An input signal applied to the base electrode of the input transistor causes an output signal to be produced at the collector electrode of the output transistor, which output signal is symmetrically limited.

A further aspect of the present invention is the selection of substantially equal emitter degeneration resistance for the input transistor and collector load resistance for the output transistor. Equal amplitude signals are developed across each resistance, which signals have an opposite sense of potential swing but are referred to the same direct potential.

Figure 2:
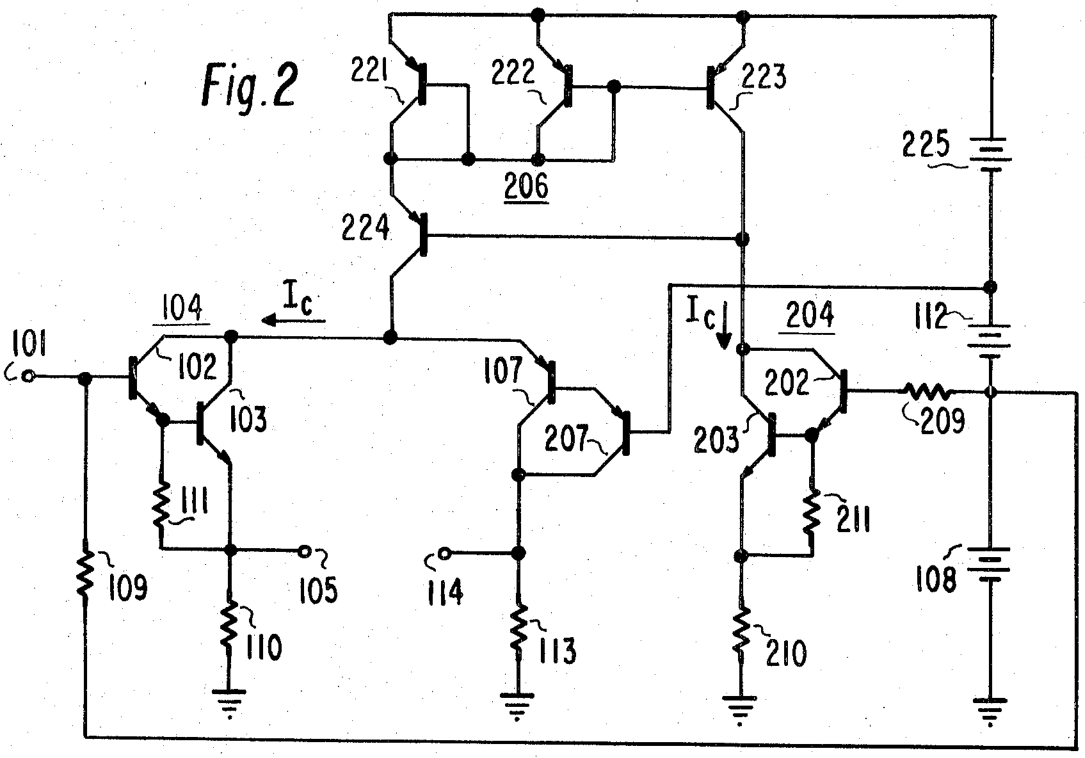
Figure 3:
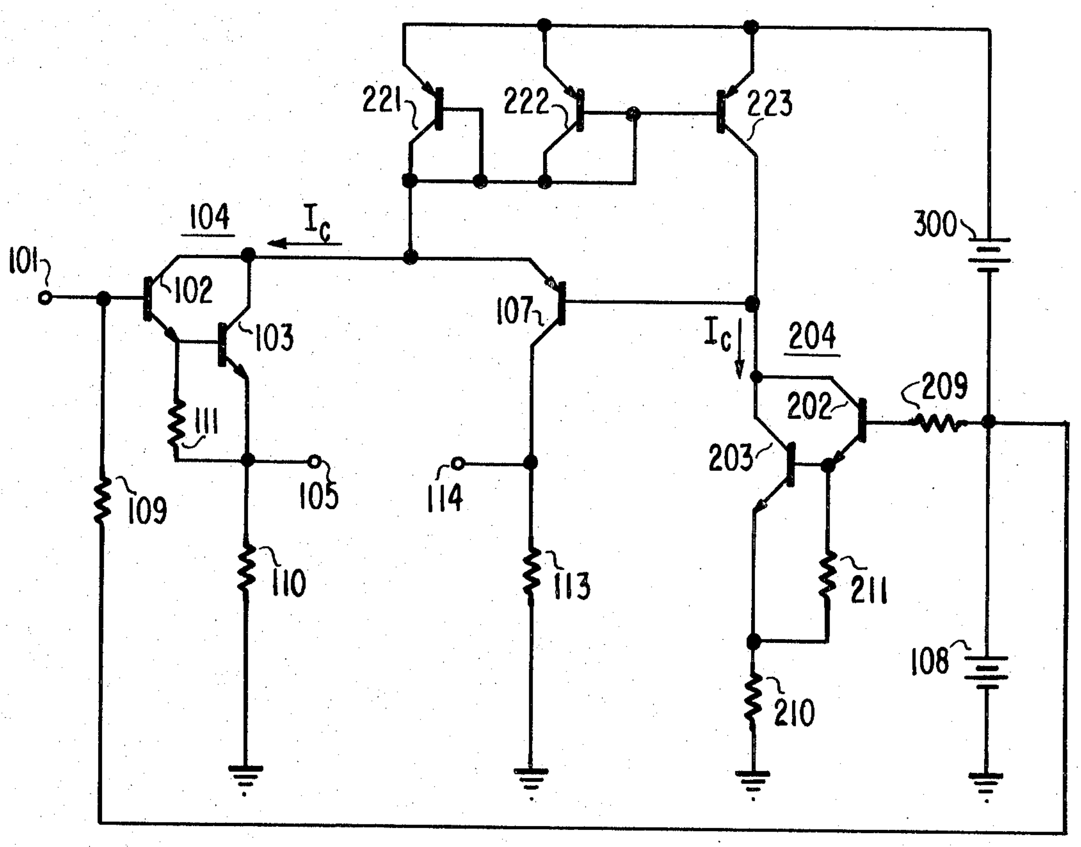

In the drawings:

FIG. 1 is a schematic diagram, partially in block form, illustrating a phase-splitting amplifier embodying the present invention; and FIGS. 2 and 3 are schematic diagrams of alternative embodiments of the phase-splitting amplifier of FIG. 1.

Referring to FIG. 1, the phase-splitting amplifier 100 accepts input signal applied to its input terminal 101. Transistors 102 and 103 connected in Darlington configuration 104 provide by emitter-follower action a signal to output terminal 105, which signal is substantially a replica of that applied to input terminal 101. A current with value $2I_c$ is supplied from current supply 106, one half of which current is to flow as combined quiescent collector currents to the Darlington configuration 104 and the other half of which current is to flow as quiescent emitter current to transistor 107.

The biasing of transistors 102, 103 so as to cause this condition is accomlished as follows. Base bias potential is applied to transistor 102 from potential supply 108 by means of resistor 109. If the resistance $R_{109}$ of resistor 109 is chosen sufficiently small, the base current of transistor 102 will cause a negligible potential drop thereacross. The potential $E_{108}$ provided from potential supply 108 will appear at the base electrode of transistor 102. Terminal 105 will be at a potential lower than $E_{108}$ by the sum of the base-emitter offset potentials of transistors 102 and 103 ($V_{BE102}$ and $V_{BE103}$, respectively, which sum to about 1.2 volts for silicon transistors). Resistor 110 has a potential substantially equal to $[E_{108} - (V_{BE102} + V_{BE103})]$ appearing thereacross. The resistance $R_{110}$ of resistor 110 can be chosen to obtain the desired value of combined quiescent collector currents $I_C$ according to Ohm's Law, the total collector and emitter currents of a Darlington configuration such as 104 being substantially equal because of Kirchoff's Current Law and the high common emitter forward current gain of the configuration. That is:

$$R_{110} = (E_{108} - V_{BE102} - V_{BE103})/I_C. \quad (1)$$

The proportion of the current $I_C$ flowing through the collector-to-emitter path of transistor 102, $I_{C102}$, can be increased by properly choosing the resistance $R_{111}$ of a resistor 111 coupling its emitter electrode to output terminal 105.

$$I_{C102} = V_{BE103}/R_{111}. \quad (2)$$

The use of resistor 111 is not necessary, but it will improve the speed of response of the Darlington configuration 104 by offering a path to discharge stored charge from the base of transistor 103 during negative-going swings of signal. The effect of the resistor 111 to reduce the input impedance seen at input terminal 101 is not pronounced, because of the well-known bootstrap effect (wherein both ends of the resistor 111 having like signal potentials thereto applied, current flow therein is reduced).

Transistor 107 has its base electrode biased positively with respect to the base electrode of transistor 102 by potential supply 112, thereby providing normal potential biasing of transistors 102, 103, 107. By Kirchoff's Current Law the portion of the $2I_C$ current provided by current source 106 not taken by the combined collector currents, $I_C$, of transistors 102, 103 must flow as the emitter current of transistor 107. This emitter current therefore must have a quiescent component $I_C$, since the quiescent combined collector currents of transistors 102, 103 equals $I_C$.

If the transistor 107 has a sufficiently high common-emitter forward current gain, its collector current substantially equals its emitter current. Therefore the quiescent component of the collector current of transistor 107 is substantially equal to $I_C$. This quiescent collector current $I_C$ flows through resistor 113, having a resistance $R_{113}$, thereby developing a quiescent potential $V_{113}$ thereacross. By Ohm's Law:

$$V_{113} = I_C R_{113}, \quad (3)$$

and by substituting for $I_C$ from equation 1:

$$V_{113} = R_{113}/R_{110}\ (E_{108} - V_{BE102} - V_{BE103}). \quad (4)$$

If $R_{113}$ is chosen equal to $R_{110}$, then the quiescent potential appearing at output terminal 114 equals ($E_{108} - V_{BE102} - V_{BE103}$). That is, the quiescent potential at output terminal 114 is substantially equal to that at output terminal 105 in such circumstances.

An input signal potential $v_{IN}$ applied to terminal 101 will—because of the emitter-follower action of transistors 102, 103—cause a similar signal potential $v_{IN}$ to appear at output terminal 105. The variation of combined emitter currents flowing into transistors 102 and 103, $i_{e104}$, can be ascertained by Ohm's Law.

$$i_{e104} = -v_{IN}/R_{110}. \quad (5)$$

The variation of the combined collector currents into transistors 102 and 103, $i_{c104}$, is given by the following expression, in which $h_{fe102}$ and $h_{fe103}$ are the common-emitter forward current gains of transistors 102 and 103, respectively.

$$I_{c104} = -\ (h_{fe102}\ h_{fe103})/(1+h_{fe102}\ h_{fe103})\ i_{e104}. \quad (6)$$

The source impedance of the current supply 106 is high since it supplies constant current $2I_C$. Therefore $-i_{c104}$ must be provided as variations of the emitter current into transistor 107, $-i_{e107}$.

The variation of the collector current into transistor 107, $i_{c107}$, is given by the following expression in which $h_{fe107}$ is its common-emitter forward current gain.

$$i_{c107} = -\ (h_{fe107})/(1+h_{fe107})\ i_{e107} \quad (7)$$

$$= (-v_{IN}/R_{110})\ [(h_{fe107})/(1+h_{fe107})]\ [(h_{fe102}\ h_{fe103})/(1+h_{fe102}\ h_{fe103})]$$

The collector current variations $i_{c107}$ flow through the resistance $R_{113}$ of resistor 113 to develop an output signal potential $v_{OUT}$. By Ohm's Law:

$$v_{OUT} = i_{C107}\ R_{113} \quad (8)$$

$$= -v_{IN}\ (R_{113}/R_{110})\ [h_{fe107}/(1+h_{fe107})]\ [h_{fe102}\ h_{fe103}/(1+h_{fe102}\ h_{fe103})]$$

Now if $h_{fe102}$, $h_{fe103}$ and $h_{fe107}$ are suitably large, to good approximation:

$$v_{OUT} = -v_{IN}\ R_{113}/R_{110}. \quad (9)$$

If $R_{113}$ is made substantially equal to $R_{110}$, then to good approximation:

$$v_{OUT} = -v_{IN} \quad (10)$$

Thus when $R_{113}$ and $R_{110}$ are essentially equal, the configuration shown in FIG. 1 acts as a phase-splitting amplifier.

No matter how $R_{113}$ and $R_{110}$ are chosen, the configuration exhibits a symmetrical limiting characteristic insofar as $v_{OUT}$ at terminal 114 is concerned. If the current supply 106 provides a substantially noise-free current (such supplies being known), the internal noise generated within transistors 102, 103, 104 does not appear in amplified form at the output terminals 105, 114 since all the transistors have substantial emitter degeneration. This is an advantage over most phase-splitters using emitter-coupled differential amplifier transistors. Furthermore, the signals at terminals 105, 114 can both swing over a potential range equal to the sum of the potentials afforded by potential supplies 108, 112.

FIG. 2 illustrates an embodiment of the present invention useful for providing a phase-splitting amplifier, the output signals from which can swing over a range substantially as large as applied operating potential. Such signals are useful, for example, to provide driving signals for first and second push-pull common-collector transistor amplifiers, respectively, arranged to supply a load connected in bridge between their output circuits.

Elements 202, 203, 204, 209, 210, and 211 correspond to elements 102, 103, 104, 109, 110, and 111, respectively. The Darlington configuration 204 is biased similarly to Darlington configuration 104. Therefore there is a combined quiescent collector current flow $I_C$ to the collector electrodes of transistors 202, 203 equal to that to the collector electrodes of transistors 102, 103. The Darlington configuration 204 receives a direct potential bias unaccompanied by signal at the base electrode of transistor 202, and its $I_C$ will be a direct current.

This direct current $I_C$ is withdrawn from the input circuit of a current amplifier 206 having a current gain substantially equal to −2. A current $I_O$ substantially equal to $2I_C$ is provided from the output circuit of current amplifier 206 to the joined collector electrodes of transistor 102, 103 and emitter electrode of transistor 107. Transistor 207 is connected in Darlington configuration with transistor 107. Therefore the base current component of the emitter current of transistor 107 is conveyed in major proportion through the emitter-to-collector path of transistor 207 to the collector electrode of transistor 107 to be rejoined with the collector current component of the emitter current of transistor 107. This makes the current gain of the common-base amplifier transistor 107 more closely equal to unity, particularly where $h_{fe107}$ is low. (Low $h_{fe}$'s, of 10 or less, are characteristic of lateral PNP transistor structures within an integrated circuit.)

The current amplifier 206 is of a known type. The three transistors 221, 222, 223, 224 have similar geometries and therefore similar operating characteristics. The collector-to-base feedback of transistor 223 (applied through the common-collector amplifier action of transistor 224) regulates its base-emitter offset potential $V_{BE223}$ to a value which permits transistor 223 to supply a direct collector current substantially equal to $I_C$. $V_{BE223}$ is impressed upon the base-emitter junctions of transistors 221, 222 also. Since their operating characteristics are the same as that of transistor 223, their collector currents each resemble that of transistor 223. Their combined collector currents, which substantially equal twice $I_C$, are coupled by the common-base amplifier action of transistor 224 to its collector electrode. The potential supply 225 needs only to supply a potential of about 2.5 volts to accommodate the forward biasing of the base-emitter junctions of transistors 221, 222, 223, 224, 107 and 207, supposing them to be silicon transistors.

A configuration similar to that shown in FIG. 2 but in which parallelled transistors 221, 222 are replaced with a single transistor having twice the effective base-emitter junction area of each of them will function in the same manner. Another alternative is to scale the elements 202, 203, 210, 211 and 219—particularly resistor 210—so the direct current demanded for the combined collector currents of transistors 202, 203 is equal to $2I_C$ and to eliminate transistor 222 in current amplifier 206 to make its current gain substantially unity. The other alternative uses less area on an integrated circuit than the configuration drawn in FIG. 2. However, the adverse effect of the base current of transistors 221, 223, 224 upon the match of $I_D$ if twice $I_C$ flow to Darlington configuration 104 is greater. This adverse effect is a second-order phenomenon and is of no consequence if the forward current gains of the PNP transistors are high enough.

FIG. 3 shows a modification of the circuit of FIG. 2 in which the functions of transistors 107 and 224 are combined. The current amplifier 106 can itself act to provide a common-base amplifier function, as described in U.S. Pat. application No. 319,365 filed Dec. 29, 1972 in the name of Steven Alan Steckler; entitled "SIGNAL COMBINING CIRCUIT"; and assigned to RCA Corporation.

In the FIG. 3 configuration elements 202, 203, 204, 209, 210, and 211 correspond to elements 102, 103, 104, 109, 110 and 111. The combined collector currents of transistors 102, 103 in Darlington configuration 104 equal $I_C$. The combined collector currents of transistors 202, 203, in Darlington configuration 204 also equal $I_C$. The transistors 221, 222, 223 have similar geometries and substantially identical operating characteristics to each other. Potential supply 300 replaces the serially connected supplies 112, 225 to provide operating potential to the emitter electrodes of transistors 221, 222, 223.

The collector current of transistor 223 is regulated so as to substantially equal the current $I_C$ withdrawn therefrom by the Darlington configuration 204. This regulation is accomplished by negative feedback from the collector electrode of transistor 223 to its base electrode, which feedback is applied through the emitter-follower action of transistor 107. $V_{BE223}$ is regulated to be the base-emitter potential required to support a collector current $I_C$. Each of the transistors 221, 222 has the same base-emitter potential applied thereto and, since their operating characteristics and that of transistor 223 are substantially the same, each of them has a collector current substantially equal to $I_C$.

The combined collector currents of transistors 221, 222 equal $2I_C$ as in the FIG. 2 configuration. In the FIG. 3 configuration, however, the total of these combined collector currents does not flow to the emitter electrode of the transistor (107) used in the collector-to-base feedback of transistor 223. A portion $I_C$ flows as combined quiesent collector currents to transistors 102, 103 leaving a quiescent current substantially equal to $I_C$ to flow to the emitter electrode of transistor 107.

Insofar as signal current $i_{c104}$ flowing into the Darlington configuration 104 is concerned, the demand therefore must, as in the previously described configurations, be supplied from the emitter electrode of transistor 107. This must be so since the collector currents of transistors 221 and 222 are each maintained invariant at substantially $I_C$ by virtue of their base-emitter junctions being parallelled with that of transistor 223, which has its collector current maintained invariant at substantially $I_C$ by its collector-to-base feedback. There is then no other available source for the signal current $i_{c104}$ demanded by the Darlington configuration 104.

The circuit alternatives discussed in connection with the configuration of FIG. 2 are available also with regard to the configuration of FIG. 3. Other modifications of the present invention will be apparent to one skilled in the art of transistor circuit design. For example, $I_C$ may be alternatively supplied to the input circuit of current amplifier 106 from the output circuit of another current amplifier, the input circuit of which samples the current flow in the emitter resistor 210 of Darlington configuration 204. Elements 202, 203, 204, 210, 211 and 219 would have to have their direct potential biasing appropriately modified. Such modifications are within the scope of the broader claims of this application.

The term "diode" in the claims is intended to be generic to diode-connected transistors such as 221, 222, as well as other forms of semiconductor rectifiers. The term "transistor" is intended to be generic to single transistors and to composite transistors such as Darlington configurations, parallel combinations of transistors, or PNP composite transistors of the type using a PNP lateral-structure transistor and at least one NPN vertical-structure transistor, in cascade connection therewith thereafter.

What is claimed is:

1. An amplifier comprising:

means for supplying reference and biasing potentials;

a first transistor of a first conductivity type and second and third transistors of a second conductivity type opposite to said first, each having a base and an emitter and a collector electrode, said first transistor base electrode being arranged to receive applied input signal and to have a first of said biasing potentials direct coupled thereto, said second transistor base electrode being connected to receive a second of said biasing potentials, the collector electrode of said third transistor being connected to the collector electrode of said first transistor and to the emitter electrode of said second transistor;

a first resistive element connecting said first transistor emitter electrode to said reference potential, of a value to cause a quiescent collector current $I_C$ to flow in response to said biasing potential;

means for biasing the base and the emitter electrodes of said third transistor to cause a constant collector current $2I_C$ to flow therethrough; and a second resistive element connecting the collector electrode of said sceond transistor to said reference potential, across which second resistive element an output signal is developed in response to said applied input signal.

2. An amplifier as claimed in claim 1 wherein said means for biasing the base and the emitter electrodes of said third transistor comprises:

a fourth transistor of said first conductivity type and fifth and sixth transistors of said second conductivity type, each having a base and an emitter and a collector electrode, said fourth transistor base electrode being connected to receive said first biasing potential, said fourth and said fifth transistor collector electrodes being direct current conductively coupled to each other and direct coupled to said third transistor base electrode, said fifth transistor base electrode and the collector and the base electrodes of said sixth transistor each being connected to said third transistor emitter electrode, the emitter electrodes of said fifth and sixth transistors each being direct current conductively coupled at a node to which a third of said biasing potentials is supplied, and a third resistive element connecting said fourth transistor emitter electrode to said reference potential.

3. An amplifier as claimed in claim 1 wherein said means for biasing the base and the emitter electrodes of said third transistor comprises:

fourth and fifth transistors respectively of said first and said second conductivity types, each having a base and an emitter and a collector electrode, the emitter electrodes of said third and said fifth transistors direct current conductively coupled to a node to which a third of said biasing potentials is supplied, the base electrodes of said third and said fourth transistors being connected to said third transistor collector electrode, the collector electrodes of said fourth and said fith transistors direct current conductively coupled together and direct coupled to said second transistor base electrode to provide said second biasing potential; and a third resistive element connecting said fourth transistor emitter electrode to said reference potential.

4. An amplifier comprising:

means for supplying reference and biasing potentials;

current amplifier means having an input terminal and output terminals between which a predetermined current gain is exhibited and having a common terminal connected to receive a first of said biasing potentials;

first and second transistors of complementary conductivity types each having a base and an emitter and a collector electrode, said first transistor base electrode being arranged to receive applied input signal and to have a second of said biasing potentials direct coupled thereto, said second transistor base electrode connected to receive a third of said biasing potentials, and said first transistor collector electrode and said second transistor emitter electrode connected to said output terminal of said current amplifier means;

first and second resistors having substantially equal resistances, said first resistor connecting said first transistor emitter electrode to said reference potential and being of value to cause a quiescent collector current $I_C$ to flow in response to said second biasing potential, and said second resistor connecting said second transistor collector electrode to said reference potential; and means for applying a bias current to the input terminal of said current amplifier means of a value to cause a current $2I_C$ to flow via its output terminal.

5. An amplifier as claimed in claim 4 wherein said means for applying a bias current comprises:

a third transistor being substantially identical to said first transistor, having a collector electrode connected to the input terminal of said current amplifying means and having a base and emitter electrodes;

means for applying quiescent biasing to the base and emitter electrodes of said third transistor such that its collector current is proportional to $I_C$.

6. In combination:

current amplifier means having an input circuit and an output circuit and exhibiting a predetermined current gain therebetween;

means for applying a direct current to the input circuit of said current amplifier means of a value to cause an output current of value $2I_C$ in the output circuit of said current amplifier means;

first and second transistor means of opposite conductivity types, each said means having collector, emitter and base electrodes, the collector electrode of the first transistor and the emitter electrode of the second transistor being coupled together and to the output circuit of said current amplifier means, the first transistor emitter electrode and the second transistor collector electrode being coupled to a point of reference potential;

means quiescently biasing the base electrodes of both transistor means in the forward direction;

a load in the coupling between said emitter electrode of said first transistor means and said point of reference potential of a value to establish a flow of current of value $I_C$ through said first transistor means; and a load in the coupling between the said collector electrode of said second transistor means and said point of reference potential, whereby in reponse to a signal applied to the base of said first transistor means, output signals of opposite phase appear at said two loads.

7. In the combination as set forth in claim 6, said loads comprising resistors of the same value.

8. In the combination as set forth in claim 6, at least said first transistor means comprising two transistors, one connected at its emitter electrode to the base and emitter electrodes of the other, and at its collector electrode to the collector electrode of the other.

* * * * *